(12) United States Patent
Henneberg et al.

(10) Patent No.: US 11,590,533 B2
(45) Date of Patent: Feb. 28, 2023

(54) SOUND TRANSDUCER, HAVING A TRANSDUCER ELEMENT INTEGRATED IN A VIBRATION-CAPABLE DIAPHRAGM INCLUDING AN ELECTRICALLY ACTIVE POLYMER

(71) Applicant: Robert Bosch GmbH, Stuttgart (DE)

(72) Inventors: Johannes Henneberg, Weil Im Schoenbuch (DE); Andre Gerlach, Leonberg-Hoefingen (DE); Marko Liebler, Bretten (DE)

(73) Assignee: Robert Bosch GmbH, Stuttgart (DE)

( * ) Notice: Subject to any disclaimer, the term of this patent is extended or adjusted under 35 U.S.C. 154(b) by 610 days.

(21) Appl. No.: 16/497,888

(22) PCT Filed: Mar. 23, 2018

(86) PCT No.: PCT/EP2018/057484
§ 371 (c)(1),
(2) Date: Sep. 26, 2019

(87) PCT Pub. No.: WO2018/177943
PCT Pub. Date: Oct. 4, 2018

(65) Prior Publication Data
US 2020/0030851 A1 Jan. 30, 2020

(30) Foreign Application Priority Data
Mar. 30, 2017 (DE) .................. 102017205376.3

(51) Int. Cl.
*B06B 1/06* (2006.01)
*H01L 41/047* (2006.01)
(Continued)

(52) U.S. Cl.
CPC .......... *B06B 1/0651* (2013.01); *H01L 41/047* (2013.01); *H01L 41/09* (2013.01);
(Continued)

(58) Field of Classification Search
CPC ... B06B 1/0651; B06B 1/0644; H01L 41/047; H01L 41/09; H01L 41/113; H01L 41/193
(Continued)

(56) References Cited

U.S. PATENT DOCUMENTS

| 4,725,994 A | 2/1988 | Kaneko et al. |
| 5,446,332 A * | 8/1995 | Rapps .................. B06B 1/0622 310/334 |

(Continued)

FOREIGN PATENT DOCUMENTS

| CN | 101473369 A | 7/2009 |
| DE | 102012201884 A1 | 8/2013 |

(Continued)

OTHER PUBLICATIONS

International Search Report for PCT/EP2018/057484, dated Jul. 2, 2018.

*Primary Examiner* — Derek J Rosenau
(74) *Attorney, Agent, or Firm* — Norton Rose Fulbright US LLP; Gerard A. Messina

(57) ABSTRACT

An acoustic transducer, in particular for an ultrasonic sensor, is proposed. The acoustic transducer has a functional group, the functional group encompassing a diaphragm cup and at least one electroacoustic transducer element. The acoustic transducer furthermore has a housing. The diaphragm cup encompasses a vibration-capable diaphragm and an encircling wall, as well as at least one electroacoustic transducer element, the transducer element being embodied to excite the diaphragm to vibrate and/or to convert vibrations of the diaphragm into electrical signals. The diaphragm cup is constituted from a plastic material, the at least one transducer element being integrated into the vibration-capable diaphragm, the transducer element having an electrically active polymer.

10 Claims, 3 Drawing Sheets

(51) Int. Cl.
*H01L 41/09* (2006.01)
*H01L 41/113* (2006.01)
*H01L 41/193* (2006.01)
*H01L 41/314* (2013.01)
*H04R 17/00* (2006.01)

(52) U.S. Cl.
CPC .......... *H01L 41/113* (2013.01); *H01L 41/193* (2013.01); *H01L 41/314* (2013.01); *H04R 17/005* (2013.01)

(58) Field of Classification Search
USPC ........................................ 310/322, 334, 335
See application file for complete search history.

(56) References Cited

U.S. PATENT DOCUMENTS

| | | | |
|---|---|---|---|
| 2011/0221304 A1* | 9/2011 | Matsumoto | G01S 7/521 310/322 |
| 2014/0038484 A1 | 2/2014 | Pezzini | |
| 2015/0008796 A1* | 1/2015 | Sun | G01H 11/08 310/334 |

FOREIGN PATENT DOCUMENTS

| | | |
|---|---|---|
| DE | 102012208059 A1 | 11/2013 |
| DE | 102013211533 A1 | 12/2014 |
| DE | 102013222076 A1 | 4/2015 |
| DE | 102015202393 A1 | 8/2016 |
| DE | 102015110939 A1 | 1/2017 |
| EP | 815954 A2 | 1/1992 |
| EP | 0477575 A1 | 4/1992 |
| JP | S5359445 A | 5/1978 |
| JP | S5359445 U | 5/1978 |
| JP | S57128298 A | 8/1982 |
| JP | S57128298 U | 8/1982 |
| JP | S5994493 A | 5/1984 |
| JP | S5994493 U | 6/1984 |
| JP | S6396460 A | 4/1988 |
| JP | S63096460 U | 6/1988 |
| JP | H05244692 A | 9/1993 |
| WO | 2016143469 A1 | 9/2016 |

* cited by examiner

SOUND TRANSDUCER, HAVING A TRANSDUCER ELEMENT INTEGRATED IN A VIBRATION-CAPABLE DIAPHRAGM INCLUDING AN ELECTRICALLY ACTIVE POLYMER

FIELD OF THE INVENTION

The invention relates to an acoustic transducer encompassing a diaphragm cup, a transducer element, and a housing, the diaphragm cup having a diaphragm and a wall.

BACKGROUND INFORMATION

Ultrasonic sensors are utilized, inter alia, in automotive and industrial applications in order to sense the environs. Objects in the environs can be detected by the fact that an ultrasonic signal is emitted by the ultrasonic sensor, and the ultrasonic echo reflected from an object is received again. The distance to the object can then be calculated from the transit time between emission of the ultrasonic signal and reception of the ultrasonic echo, and from the known speed of sound.

Ultrasonic sensors typically encompass an acoustic transducer having a diaphragm, a transducer element, and a housing. The transducer element is, for example, a piezoceramic element that causes the diaphragm to vibrate after application of an electrical voltage and, for the reception of ultrasonic echoes, converts the vibrations on the diaphragm, which are excited by the acoustic pressure in front of the diaphragm, into an electrical signal. Acoustic transducers of this kind are known in the existing art (see e.g. DE 10 2012 201 884 A1).

The join between the piezoceramic element and the diaphragm bottom is usually produced by way of an adhesion process. This is subject to failure both during the production process and in operation. The functional group of the ultrasonic sensor, and the housing, are produced as separate individual parts and then fitted together.

DE 10 2013 222 076 A1 describes an acoustic transducer that has a resonator having at least one piezoelectric element. The resonator is embodied in one piece as a diaphragm cup having a diaphragm and an encircling enveloping surface made of the same material. The diaphragm cup is manufactured, for example, from a polymer material such as polyvinylidene fluoride (PVDF), or from a piezoceramic material. One or several regions of the diaphragm are polarized so that piezoelectrically active regions are formed.

Proceeding therefrom, the object on which the invention is based is to describe an acoustic transducer having a simplified manufacturing method and a simplified configuration.

SUMMARY

According to an embodiment of the present invention, an acoustic transducer, in particular for an ultrasonic sensor, is proposed.

The acoustic transducer has a functional group, the functional group encompassing a diaphragm cup and at least one electroacoustic transducer element. The acoustic transducer furthermore has a housing. The diaphragm cup encompasses a vibration-capable diaphragm and an encircling wall, as well as at least one electroacoustic transducer element, the transducer element being embodied to excite the diaphragm to vibrate and/or to convert vibrations of the diaphragm into electrical signals. The diaphragm cup is constituted from a plastic material, according to the present invention the at least one transducer element being integrated into the vibration-capable diaphragm, the transducer element encompassing an electrically active polymer.

Piezoelectric polymers or piezoelectrets, for example, can be used as an electrically active polymer. A thermosetting plastic, or alternatively a thermoplastic, can be used, for example, as a plastic material of the diaphragm cup including the vibration-capable diaphragm. Epoxy resins are particularly suitable as plastic materials. Carbon fiber- and glass fiber-reinforced epoxy resins are to be recited as particularly suitable plastic materials.

Integration of the transducer element, having an electrically active polymer, into the vibration-capable diaphragm of the acoustic transducer makes electromechanical transduction possible.

The sensor thereby embodied can be used both to receive and to transmit sound, in particular ultrasound. Configuration of a specific desired vibration shape and frequency can be achieved by geometric configuration in the diaphragm. For this purpose, for example, regions of the diaphragm can be embodied with different thicknesses. Usual working frequencies are in the range between 20 and 250 kHz; frequencies in the range from 30 to 80 kHz are particularly suitable.

An acoustic transducer embodied according to the present invention has the particular advantage that manufacturing costs are significantly decreased as a result of the reduction in the number of components compared with the existing art. It is furthermore possible, during manufacture, to dispense with a failure-prone adhesive join for attaching a separate electroacoustic or electromechanical transducer element onto the vibration-capable diaphragm. The construction process is thereby further simplified. Subsequent polarization of only a specific region of the vibration-capable diaphragm in order to constitute a transducer element, as known from the existing art, is likewise avoided.

Acoustic transducers embodied according to the present invention can thus advantageously be utilized in sensors for distance determination, e.g. via airborne ultrasound. Utilization for distance determination in liquids is likewise conceivable. Thanks to the one-piece configuration and the resulting robustness with respect to environmental influences, acoustic transducers embodied according to the present invention are suitable in particular for utilization in automobiles.

In a particularly preferred embodiment of the invention, the housing and the functional group of the acoustic transducer are embodied in one piece or as one component.

An acoustic transducer embodied according to the present invention can have, in particular, one or several electrical conductors for electrical contacting, the transducer element or the several transducer elements being contacted by the electrical conductor or conductors. By applying electrical signals to those conductors, it is possible in known fashion to excite vibrations of the transducer element which are transferred to the diaphragm and result in the emission of acoustic signals, in particular ultrasonic signals, by the acoustic transducer (transmission mode of the acoustic transducer). Incident acoustic waves can furthermore excite the diaphragm to vibrate, the result being that an electrical voltage signal, which is picked off by the conductors, is generated in the transducer element (reception mode of the acoustic transducer). In order to generate the electrical signals for excitation of the diaphragm in the transmission mode, and/or in order to evaluate the voltage signals generated by incident acoustic waves in the transducer element in the reception mode, the conductors can be electrically connected, for example by way of a plug connection, to a control device embodied to generate and/or evaluate the signals.

In a preferred embodiment of the invention, at least one transducer element is embodied in disk-shaped fashion and has a first surface and a second surface located oppositely from the first surface. The transducer element is integrated into the diaphragm in such a way that the second surface is exposed toward the interior of the diaphragm cup.

This embodiment offers the advantage that the element can easily be electrically contacted because the second surface of the transducer element is exposed toward the inside. At least one electrical conductor can be contacted directly onto the exposed second surface.

In an alternative preferred embodiment of the invention, at least one transducer element is embodied in disk-shaped fashion and has a first surface and a second surface located oppositely from the first surface. The transducer element is integrated into the diaphragm in such a way that the first surface is exposed in the emission direction of the diaphragm cup. The "emission direction" is understood here as that direction, perpendicular to the extent of the diaphragm, in which an acoustic signal is preferentially emitted upon excitation of the diaphragm to vibrate mechanically. This disposition of the transducer element has the advantage of direct coupling of the piezoelectric element to the surrounding fluid. This represents an advantage in particular with low-density fluids.

In a further preferred embodiment of the invention, at least two transducer elements are integrated into the diaphragm. These at least two transducer elements are preferably embodied in disk-shaped fashion and are disposed parallel to one another with reference to the longitudinal axis of the diaphragm cup. An elevated sensitivity for the acoustic transducer can be achieved with this type of multi-layer disposition of transducer elements. The elevated sensitivity is achieved, for example, by the fact that in the transmission mode, some or all of the several transducer elements are activated simultaneously. Greater mechanical stress can thereby be achieved in the diaphragm, resulting in an increased deflection of the diaphragm and thus increased transmission power output on the part of the acoustic transducer. With the acoustic transducer in the reception mode, the received signal can be picked off at two or more transducer elements and correlated. This results in an improved signal-to-noise ratio, with the result that the reception sensitivity can be considerably increased.

Preferably, at least one transducer element can be embodied as a prefabricated polymer film. "Prefabricated" means in this context that the transducer element is generated in a previously defined shape from a polymer film, for example cut out or punched out. Alternatively, a transducer element can be embodied, for example, as a pre-shaped component encompassing a polymer fiber material.

In an alternative embodiment of the invention, at least one transducer element is generated by silkscreen printing, spin coating, or a casting process. Transducer elements can thereby be embodied to be particularly thin and/or can be produced in particularly material-saving fashion.

According to a second aspect of the invention, a possible manufacturing method for an acoustic transducer embodied according to the present invention, using injection molding or resin transfer molding, is described.

The method encompasses, in particular, the following steps:

a) at least one transducer element having an electrically active polymer is introduced into a cavity of a plastic-processing tool;

b) a plastic material is injected into the cavity, the transducer element being surrounded at least partly by the plastic material, with the result that a diaphragm cup having a vibration-capable diaphragm and a wall is constituted, the at least one transducer element being integrated into the vibration-capable diaphragm.

The method steps a) and b) according to the present invention need not obligatorily be performed in that order. It is also possible in the context of the invention, for example, that firstly plastic material is injected into the cavity and, subsequently thereto, at least one transducer element having an electrically active polymer is introduced into a cavity of a tool of an injection molding machine. Preferably, however, firstly the transducer element having an electrically active polymer is introduced into the cavity, and then the plastic material is injected.

Electrical conductors (e.g. pins) can be integrated into the cavity for electrical contacting of the transducer element. A further variant for electrical contacting of the transducer element involves wire contacting of the transducer element before it is introduced into the cavity of the plastic-processing tool.

The manufacturing method according to the present invention makes possible simple and economical manufacture of an acoustic transducer, for example for an ultrasonic sensor, on the basis of active polymers that constitute transducer elements and are integrated into the diaphragm. It is thereby possible to omit, during manufacture, a failure-prone adhesive join for coupling an electroacoustic or electromechanical transducer element, thus resulting in a simplified construction process. The functional group of the acoustic transducer, and the housing, can furthermore preferably be produced in one working step as a one-piece complete component. This yields a continuous component having elevated robustness with respect to environmental influences, for example the entry of moisture or contaminants.

In a preferred embodiment of the invention, the cavity of the plastic-processing tool is embodied in such a way that in step b), the functional group is embodied in one piece with a housing of the acoustic transducer. The advantages yielded by the one-piece configuration are that the completed component exhibits elevated robustness with respect to environmental influences, for example the entry of moisture or contaminants; and that furthermore the number of components of the acoustic transducer, and the number of working steps required in order to assemble the acoustic transducer, are decreased.

As already mentioned, at least one transducer element can be embodied as a prefabricated polymer film or a pre-shaped component encompassing a polymer fiber material. The acoustic element thereby constituted can be placed, in step a) of the method, into the cavity of the tool of the injection molding machine.

Alternatively or additionally, in step a) at least one transducer element can be introduced into the cavity of the tool of the injection molding machine by silkscreen printing, spin-coating, or a casting method.

DETAILED DESCRIPTION

Figure 1:
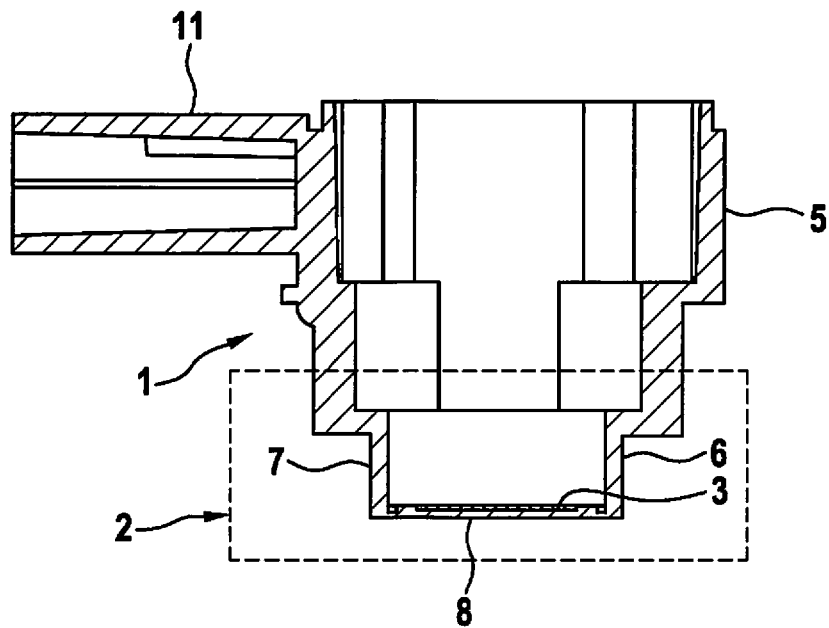
FIG. 1a) schematically shows an acoustic transducer in accordance with a first embodiment of the invention.
FIG. 1b) is an enlarged view of the functional group of the acoustic transducer shown in FIG. 1a).
Figure 1:
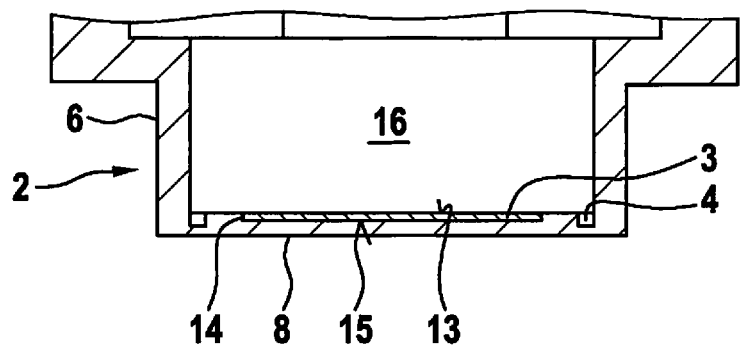

In the description below of exemplifying embodiments of the invention, identical elements are labeled with identical reference characters, repeated description of those elements being dispensed with as applicable. The Figures are merely a schematic depiction of the subject matter of the invention.

FIG. 1a) schematically illustrates a section through an acoustic transducer 1 in accordance with a first embodiment of the invention. The acoustic transducer has a housing 5 having a plug housing 11. The acoustic transducer encompasses a functional group 2 that is embodied in one piece with the housing. The functional group encompasses a diaphragm cup 6 having a vibration-capable diaphragm 8 and an encircling wall 7. Diaphragm 8 can be, for example, circular or elliptical in shape. The diaphragm has regions 4 having a reduced thickness or a reduced wall thickness. The vibration behavior and the resonant frequency of the acoustic transducer are determined by the geometric conformation of these regions. In this example, diaphragm cup 6 is embodied in one piece. The encircling wall 7 furthermore transitions directly into housing 5, plug housing 11 also being embodied in one piece with housing 5. Acoustic transducer 1 furthermore has a transducer element 3 which, according to the present invention, has an electrically active polymer and into which the vibration-capable diaphragm 8 is integrated.

FIG. 1b) is an enlarged depiction of functional group 2 of acoustic transducer 1 in accordance with the first exemplifying embodiment. In this example, transducer element 3 is embodied as a disk or a film having a first surface 15, a second surface 13 located oppositely from the first surface, and an encircling lateral surface 14. Transducer element 3 is integrated into the diaphragm in such a way that second surface 13 is exposed toward interior 16 of diaphragm cup 6. Transducer element 3 is integrated into diaphragm 8 in such a way that both first surface 15 and lateral surface 14 of transducer element 3 are completely surrounded by the plastic material of diaphragm 8, in such a way that second surface 13 terminates flush with the diaphragm.

Figure 2:
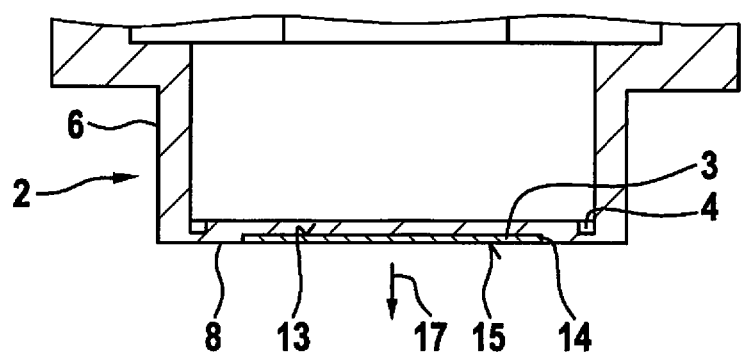
FIG. 2 schematically shows a functional group of an acoustic transducer in accordance with a second embodiment of the invention.

FIG. 2 is an enlarged depiction of functional group 2 of an acoustic transducer 1 in accordance with a second exemplifying embodiment of the invention. In this example, transducer element 3 is embodied as a disk having a first surface 15 and a second surface 13 located oppositely from the first surface. Transducer element 3 is integrated into the diaphragm in such a way that first surface 15 is exposed in emission direction 17 of acoustic transducer 1. The electrical conductors, e.g. wires or pins (not depicted), for contacting transducer element 3 can be passed, for example, through the plastic material of diaphragm 8.

Figure 3:
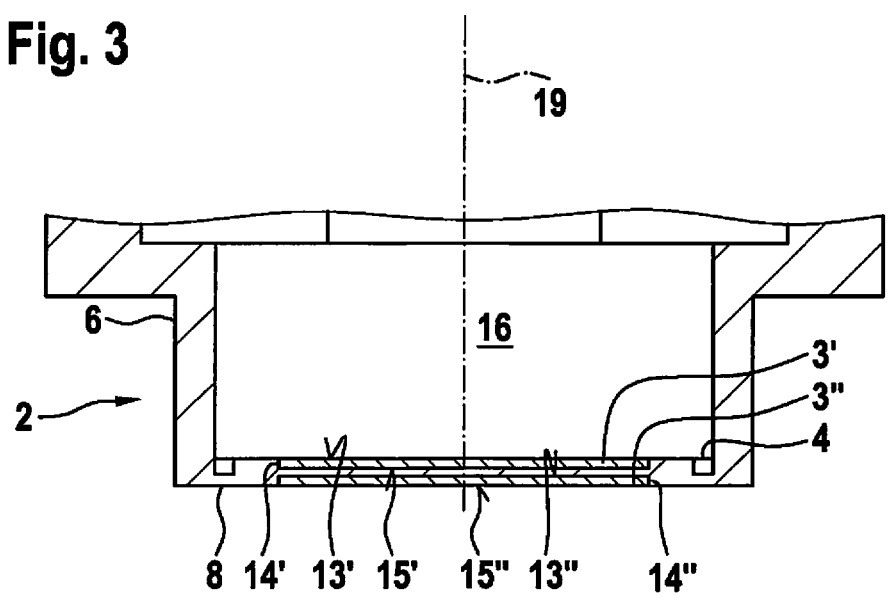
FIG. 3 schematically shows a functional group of an acoustic transducer in accordance with a third embodiment of the invention.

FIG. 3 is an enlarged depiction of functional group 2 of acoustic transducer 1 in accordance with a third exemplifying embodiment of the invention. In this example, two transducer elements 3',3" are integrated into diaphragm 8. The two transducer elements 3',3" are embodied to be disk-shaped, each having a first surface 15',15", a second surface 13',13" located oppositely from the first, and an encircling lateral surface, and are disposed with their surfaces parallel to one another with reference to longitudinal axis 19 of diaphragm cup 6. First transducer element 3' is integrated into diaphragm 8 in such a way that a second surface 13' is exposed toward interior 16 of diaphragm cup 6. First transducer element 3' is integrated into diaphragm 8 in such a way that both first surface 15' and lateral surface 14' of transducer element 3' are completely surrounded by the plastic material of diaphragm 8, in such a way that second surface 13' terminates flush with diaphragm 8. First transducer element 3' is integrated into diaphragm 8 in such a way that a second surface 13' is exposed toward interior 16 of diaphragm cup 6. Second transducer element 3" is integrated into diaphragm 8 in such a way that transducer element 3" is completely surrounded by the plastic material of diaphragm 8, i.e. so that none of surfaces 13",15", and 14" is exposed. An ultrasonic sensor that encompasses an acoustic transducer in accordance with this embodiment can exhibit particularly high measurement sensitivity. Transducer elements 3' and 3", which according to the present invention have an electrically active polymer, can be embodied identically. It is also conceivable, however, to embody transducer elements 3' and 3" differently, for example with different materials, geometric shapes, and/or material thicknesses.

Figure 4:
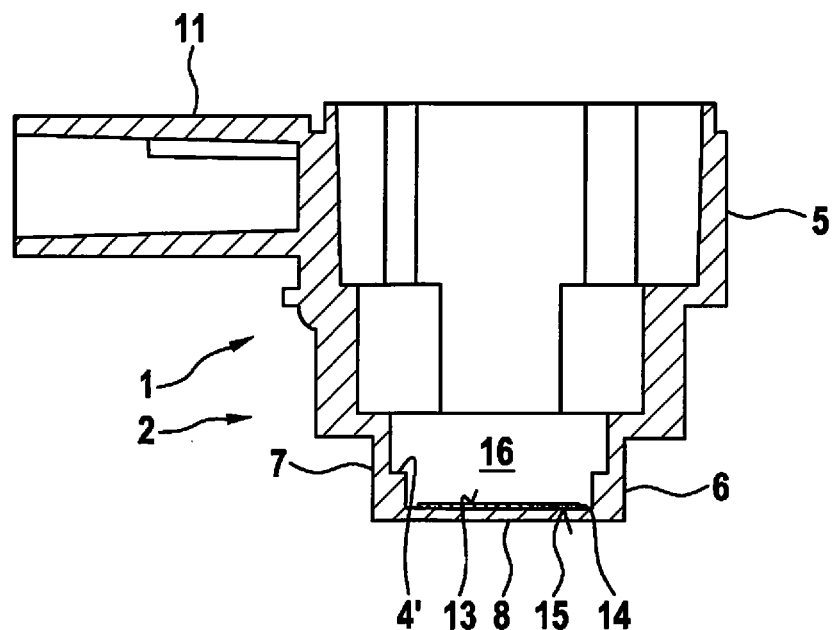
FIG. 4 schematically shows an acoustic transducer in accordance with a fourth embodiment of the invention.

FIG. 4 schematically depicts a section through an acoustic transducer 1 in accordance with an exemplifying fourth embodiment of the invention. The acoustic transducer once again has a housing 5 having a plug housing 11. The acoustic transducer encompasses a functional group 2 that is embodied in one piece with the housing. The functional group encompasses a diaphragm cup 6 having a vibration-capable diaphragm 8 and an encircling wall 7. Acoustic transducer 1 furthermore has a transducer element 3 which, according to the present invention, is embodied as a piezoceramic element and into which vibration-capable diaphragm 8 is integrated. In this example as well, transducer element 3 is embodied as a disk having a first surface 15, a second surface 13 located oppositely from the first surface, and an encircling lateral surface 14. Transducer element 3 is integrated into the diaphragm in such a way that second surface 13 is exposed toward interior 16 of diaphragm cup 6. Lateral surface 14 is surrounded only partly, or not at all, by the plastic material of diaphragm 8. This yields possible advantages in terms of the manufacturing process. Alternatively, as also depicted in FIGS. 1 and 2, transducer element 3 can be integrated into the diaphragm in such a way that only one surface 13 or 15 is exposed.

In accordance with the fourth embodiment of the invention, regions 4' of the diaphragm have an elevated thickness (material accumulation). The resonant frequency of the acoustic transducer and the directional characteristic of the acoustic transducer can be adapted by way of the configuration of regions 4'. Regions 4' can be disposed regularly (symmetrically) or irregularly (asymmetrically).

Figure 5:
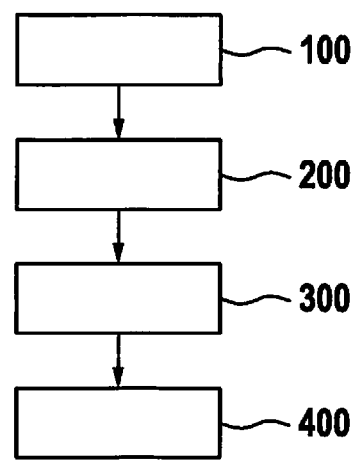
FIG. 5 schematically shows a flow chart of a possible embodiment of a method according to the present invention.

FIG. 5 depicts the execution of a method according to the present invention for manufacturing a functional group of an acoustic transducer according to the present invention.

In step 100, a plastic-processing tool, having a cavity whose shape is adapted to the desired shape of the acoustic transducer, is furnished.

In step 200, an element that has an electrically active polymer and is provided as a transducer element is introduced into the cavity. Optionally, electrical conductors that contact the electrodes of the transducer element can already be provided.

In step 300, a plastic material, for example an epoxy resin, is injected into the cavity, with the result that at least the functional group of the acoustic transducer is constituted, and the transducer element becomes surrounded at least in part by the plastic material. If the cavity is correspondingly configured, not only the functional group of the acoustic transducer but also the housing can be constituted in one component.

In step 400, if applicable after a solidification time, the functional group, or the component encompassing the functional group and the housing of the acoustic transducer, is removed.

What is claimed is:

1. An acoustic transducer, comprising:
a functional group encompassing a diaphragm cup and at least one electroacoustic transducer element; and
a housing having a plug housing, wherein:
the diaphragm cup includes a vibration-capable diaphragm and an encircling wall,
the transducer element is adapted to at least one of: (i) excite the vibration-capable diaphragm to vibrate, and (ii) convert vibrations of the diaphragm into an electrical signal,
the diaphragm cup includes a plastic material,
the transducer element is integrated into the vibration-capable diaphragm, and
the transducer element includes an electrically active polymer;
wherein the vibration-capable diaphragm includes at least one of regions having a reduced thickness, and regions having an elevated thickness, wherein a vibration behavior and a resonant frequency of the acoustic transducer are determined by a geometric conformation of the regions,
wherein the transducer element includes a first surface and a second surface located opposite from the first surface,
wherein the transducer element is integrated into the vibration-capable diaphragm so that the second surface is exposed toward an interior of the diaphragm cup,
wherein the transducer element and the further transducer element each has a respective disk-shaped body and are disposed parallel to one another with reference to a longitudinal axis of the diaphragm cup,
wherein each of the transducer elements is disk-shaped, having a first surface and a second surface located oppositely from the first, and an encircling lateral surface, and each of the transducer elements is disposed with its surfaces parallel to one another with reference to a longitudinal axis of the diaphragm cup,
wherein the first transducer element is integrated into the diaphragm so that a second surface is exposed toward an interior of the diaphragm cup,
wherein the first transducer element is integrated into the diaphragm so that the second surface terminates flush with the diaphragm, and
wherein the first transducer element is integrated into the diaphragm so that a second surface is exposed toward an interior of the diaphragm cup, so that none of the surfaces is exposed.

2. The acoustic transducer as recited in claim 1, wherein the transducer element has a disk-shaped body.

3. The acoustic transducer as recited in claim 1, wherein the transducer element has a substantially disk-shaped body.

4. The acoustic transducer as recited in claim 1, further comprising:
at least one electrical conductor, wherein the transducer element is contacted by the at least one electrical conductor.

5. The acoustic transducer as recited in claim 1, wherein at least one further transducer element is integrated into the vibration-capable diaphragm.

6. The acoustic transducer as recited in claim 5, wherein the first transducer element is integrated into the diaphragm so that both the first surface and the lateral surface of the transducer element are completely surrounded by the plastic material of the diaphragm, and wherein the second transducer element is integrated into the diaphragm so that the transducer element is completely surrounded by the plastic material of the diaphragm.

7. The acoustic transducer as recited in claim 1, wherein the housing and the functional group are embodied in one piece.

8. The acoustic transducer as recited in claim 1, wherein the transducer element includes one of a prefabricated polymer film and a pre-shaped component encompassing a polymer fiber material.

9. The acoustic transducer as recited in claim 1, wherein the transducer element is generated by one of silkscreen printing, spin coating, and a casting process.

10. An ultrasonic sensor, comprising:
an acoustic transducer, including:
a functional group encompassing a diaphragm cup and at least one electroacoustic transducer element; and
a housing having a plug housing, wherein:
the diaphragm cup includes a vibration-capable diaphragm and a wall,
the transducer element is adapted to at least one of: (i) excite the vibration-capable diaphragm to vibrate, and (ii) convert vibrations of the diaphragm into an electrical signal,
the diaphragm cup includes a plastic material,
the transducer element is integrated into the vibration-capable diaphragm, and
the transducer element includes an electrically active polymer;
wherein the vibration-capable diaphragm includes at least one of regions having a reduced thickness, and regions having an elevated thickness, wherein a vibration behavior and a resonant frequency of the acoustic transducer are determined by a geometric conformation of the regions,
wherein the transducer element includes a first surface and a second surface located opposite from the first surface, and
wherein the transducer element is integrated into the vibration-capable diaphragm so that the second surface is exposed toward an interior of the diaphragm cup,
wherein the transducer element and the further transducer element each has a respective disk-shaped body and are disposed parallel to one another with reference to a longitudinal axis of the diaphragm cup,
wherein each of the transducer elements is disk-shaped, having a first surface and a second surface located oppositely from the first, and an encircling lateral surface, and each of the transducer elements is disposed with its surfaces parallel to one another with reference to a longitudinal axis of the diaphragm cup,
wherein the first transducer element is integrated into the diaphragm so that a second surface is exposed toward an interior of the diaphragm cup, wherein the first transducer element is integrated into the diaphragm so that the second surface terminates flush with the diaphragm, and wherein the first transducer element is integrated into the diaphragm so that a second surface is exposed toward an interior of the diaphragm cup, so that none of the surfaces is exposed.

\* \* \* \* \*